United States Patent
Wu et al.

(10) Patent No.: US 10,269,590 B2
(45) Date of Patent: Apr. 23, 2019

(54) SCRUBBING APPARATUS FOR ELECTRONIC MODULE

(71) Applicant: UNIVERSAL SCIENTIFIC INDUSTRIAL (SHANGHAI) CO., LTD., Shanghai (CN)

(72) Inventors: Jiang Wu, Shanghai (CN); Wenjing Huang, Shanghai (CN)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/683,755

(22) Filed: Aug. 22, 2017

(65) Prior Publication Data

US 2018/0204744 A1 Jul. 19, 2018

(30) Foreign Application Priority Data

Jan. 17, 2017 (CN) .......................... 2017 1 0041068

(51) Int. Cl.
*B08B 1/04* (2006.01)
*B08B 3/08* (2006.01)
(Continued)

(52) U.S. Cl.
CPC .......... *H01L 21/67046* (2013.01); *B08B 1/04* (2013.01); *B08B 3/08* (2013.01);
(Continued)

(58) Field of Classification Search
CPC combination set(s) only.
See application file for complete search history.

(56) References Cited

U.S. PATENT DOCUMENTS

| 6,055,694 | A | * | 5/2000 | Steere | H01L 21/6704 15/21.1 |
| 2004/0170766 | A1 | * | 9/2004 | Inoue | C23C 18/1619 427/355 |
| 2013/0224438 | A1 | * | 8/2013 | Matsuyama | H01L 21/31116 428/157 |

FOREIGN PATENT DOCUMENTS

| CN | 101355020 A | 1/2009 |
| CN | 105514037 A | 4/2016 |

OTHER PUBLICATIONS

Office Action to corresponding Chinese patent application No. CN201710041068.8, dated Jan. 2, 2019, 4 pages total.

\* cited by examiner

*Primary Examiner* — Mikhail Kornakov
*Assistant Examiner* — Natasha N Campbell

(57) ABSTRACT

The present disclosure discloses an automatic scrubbing apparatus for an electronic module and an automatic scrubbing method thereof. The automatic scrubbing apparatus for an electronic module comprises: a fixing mechanism for limiting and fixing the electronic module, a cleaning brush, a driving mechanism, and a spraying mechanism for spraying the bromine-based cleaning agent on the surface of the electronic module. The fixing mechanism comprises a carrier for providing a groove to hold the electronic module, and the depth of the groove is smaller than the height of the electronic module to expose debris on the side surface of the electronic module. The fixing mechanism further comprises a fixing frame, the fixing frame locates above the electronic module to limit the electronic module. The debris on the side surface and the foreign body on the back of the product can be effectively cleaned, so that the cleaning quality is improved.

6 Claims, 4 Drawing Sheets

(51) Int. Cl.
  *B08B 11/02* (2006.01)
  *H01L 21/67* (2006.01)
(52) U.S. Cl.
  CPC .......... *B08B 11/02* (2013.01); *H01L 21/6719* (2013.01); *H01L 21/67051* (2013.01)

SCRUBBING APPARATUS FOR ELECTRONIC MODULE

CROSS-REFERENCE TO RELATED APPLICATION

This application claims priority to Chinese patent application Serial No. CN201710041068.8, filed on Jan. 17, 2017, which is incorporated herein by reference as if reproduced in its entirety.

TECHNICAL FIELD

The present disclosure relates to the field of processing equipment and the assembly process of electronic products, especially, relates to an automatic scrubbing apparatus for an electronic module and an automatic scrubbing method thereof.

BACKGROUND

In the semiconductor field, system in package (SIP) is the trend of the present packaging products, the printed circuit board (PCB) can be made to PCBA after surface mount technology (SMT), then the upper surface of the PCBA is filled with sealant to form molding, which is solidified to form the electronic module.

Currently, debris on the side surface of the electronic module is usually cleaned by scratching the side surface of the product with a mylar film, so the problems that positioning shift of the mylar film and the lack of precision of surface mounting will both impact the effect of scratching the debris. Moreover, the brush dipped with cleaning fluid solution is also artificially used to scrub the welding position on the surface of the electronic module, which cost labor costs with a low scrubbing efficiency and large intensity of labor, and it is also determined by proficiency and meticulous degree of the operator, so it is difficult to ensure the cleaning quality of the electronic module.

SUMMARY

The purpose of the present disclosure is to provide an automatic scrubbing apparatus for an electronic module to achieve automatic scrubbing for the electronic module.

Another purpose of the present disclosure is to provide an automatic scrubbing method for an electronic module.

The present disclosure provides following technical solution: an automatic scrubbing apparatus for the electronic module, comprising: a fixing mechanism for limiting and fixing the electronic module, a cleaning brush for brushing the electronic module, a driving mechanism for driving the cleaning brush to rotate and move and a spraying mechanism for spraying the bromine-based cleaning agent on the surface of the electronic module.

The debris on the surface of the electronic module can be cleaned by the mechanical rotation of the cleaning brush. So different scrubbing lines can be established to solve the problems that there are too much debris on a specific position or on the irregular shaped product, which will liberate labor and improve work efficiency. At the same time, by spraying the bromine-based cleaning agent on the surface of the electronic module, the adhesive residual glue can be dissolved, which can improve scrubbing effect of the cleaning brush.

Preferably, the fixing mechanism comprises a carrier for providing a groove to hold the electronic module, and the depth of the groove is smaller than the height of the electronic module to expose debris on the side surface of the electronic module. It enables the cleaning brush scrubbing the debris on the side surface, especially on the sides thoroughly, which can expand the scope of the cleaning and achieve a better effect.

The fixing mechanism comprises a fixing frame, the fixing frame locates above the electronic module to limit the electronic module, and the moving track of the fixing frame and the track of the cleaning brush do not interfere with each other. The electronic module can be tightly fixed by the structure combination of the fixing frame and the carrier, which can effectively prevent the board falling during a scrubbing process. Also, the entire cleaning process will be more stable and reliable.

Preferably, the moving direction of the cleaning brush and the side surface of the electronic module are at an angle of 20°-70°. Therefore, the cleaning brush can full contact with the side surface the electronic module, especially its sides, ensuring the cleaning brush can evenly scrub each side. The cleaning brush and the side surface adjacent to it are in a certain angle when the cleaning brush passing the electronic module, so that debris on the adjacent side surfaces can be scrubbed simultaneously, especially the debris on the sides.

Specifically, the bromine-based cleaning agent is bromopropane.

Preferably, the carrier is a polytetrafluoroethylene carrier. Polytetrafluoroethylene has corrosion resistance to the cleaning agent. And it can reduce the wear for the clad layer on the back of the electronic module.

Specifically, the fixing frame is a stainless steel fixing frame with a chess board structure.

At least one of following advantageous effects can be gotten by the scrubbing apparatus for an electronic module provided by the present disclosure:

1. Scrubbed by the cleaning brush and with the assistance of the bromine-based cleaning agent dissolving the adhesive residual glue, the debris and the foreign body of the products can be effectively cleaned.

2. When put in the carrier, the electronic module is exposed and is set in a certain angle with the moving direction of the cleaning brush, so that the cleaning brush can fully contact the debris and foreign body on the surface and the sides of the electronic module. And the cleaning quality for the debris on the side surface can be greatly improved.

3. The action of the cleaning brush can be automatically controlled, so it can adapt to different shapes of product type and save labor cost with a higher effectiveness.

4. The electronic module can be positioned by the combination mechanism of the carrier and the fixing frame, so it becomes convenient for the cleaning brush to implement the cleaning, and it can prevent the electronic module offsetting or falling, so as to avoid impacting the cleaning effect.

The present disclosure also discloses an automatically scrubbing method for an electronic module, comprising following steps:

S100, placing the electronic module in a carrier and exposing debris on the side surface of the electronic module; then fixed arranging a fixing frame above the electronic module to limit the electronic module;

S200, cleaning the surface of the electronic module by driving the cleaning brush, and spraying the bromine-based cleaning agent on the electronic module by a spraying mechanism, and the moving track of the cleaning brush and the fixing frame do not interfere with each other;

S300, drying and then putting out the electronic module.

The debris on the surface of the electronic module can be cleaned by the mechanical rotation of the cleaning brush, so different scrubbing lines can be established to solve the problems that there is too much debris on a specific position or on the irregular shaped product, which will liberate labor and improve work efficiency. At the same time, by spraying the bromine-based cleaning agent on the surface of the electronic module, the adhesive residual glue can be dissolved, which can improve scrubbing effect of the cleaning brush. As debris on the side surface of the electronic module is exposed, it enables the cleaning brush scrubbing the debris on the side surface, especially side thoroughly, which can expand the scope of the cleaning and achieve a better effect. The position of the electronic module is limited by above fixing frame, which can effectively prevent the board falling during a scrubbing process caused by too large force between the cleaning brush and the electronic module. Also, the entire cleaning process will be more stable and reliable.

Preferably, the step S100 comprises step S110, placing the electronic module to enable the side surface of the electronic module and the moving direction of the cleaning brush being at an angle of 20°-70°. Therefore, the cleaning brush can full contact with the side surface the electronic module, especially its sides, ensuring the cleaning brush can evenly scrub each side. The cleaning brush and the side surface adjacent to it are in a certain angle when the cleaning brush passing the electronic module, so that debris on the adjacent side surfaces can be scrubbed simultaneously, especially the debris on the sides.

Specifically, the bromine-based cleaning agent used is bromopropane.

Specifically, the carrier used is a polytetrafluoroethylene carrier. Polytetrafluoroethylene has corrosion resistance to the cleaning agent. And it can reduce the wear for the clad layer on the back of the electronic module.

Specifically, the fixing frame is a stainless steel fixing frame with a chess board structure.

At least one of following advantageous effects can be gotten by the scrubbing apparatus for the electronic module provided by the present disclosure:

1. By the combined use of the cleaning brush and the bromine-based cleaning agent, the debris on the side surface and the foreign body on the back of the product can be effectively cleaned, so as to improve the cleaning quality.

2. When put in the carrier, the electronic module is exposed and is set in a certain angle with the moving direction of the cleaning brush, so that the cleaning brush can fully contact the debris and foreign body on the surface and the sides of the electronic module and the cleaning quality for the debris on the side surface can be greatly improved.

3. The cleaning brush and the bromine-based cleaning agent can be automatically controlled, so it can adapt to different shapes of product type and save labor cost with a higher effectiveness.

4. The electronic module can be positioned by the combination mechanism of the carrier and the fixing frame, so it becomes convenient for the cleaning brush to implement the cleaning, and it can prevent the electronic module offsetting or falling, so as to avoid impacting the cleaning effect.

BRIEF DESCRIPTION OF THE DRAWINGS

Preferred embodiments will be described in the following illustrative in conjunction with the accompanying drawings in a clear and understandable manner, which will further describe the above features, technical features, advantages and implementation of an automatic scrubbing apparatus for the electronic module.

DESCRIPTION OF THE REFERENCE NUMBER

Figure 1:
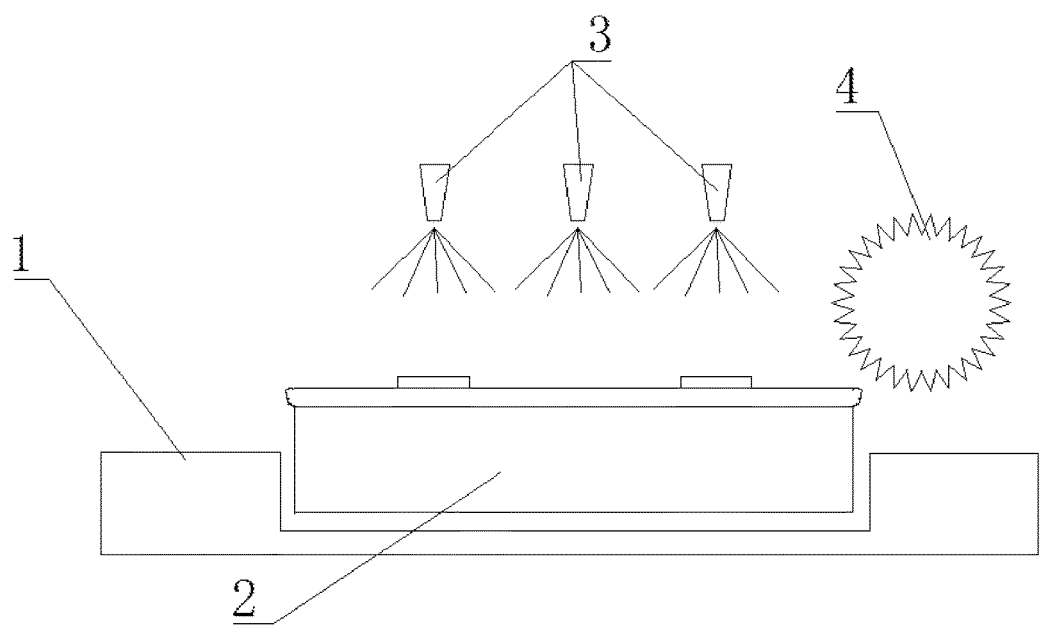
FIG. 1 is a structure diagram of an automatic scrubbing apparatus for the electronic module.

1. Carrier,
11. Groove,
12. Through hole,
2. Electronic module,
3. Nozzle,
4. Cleaning brush,
5. Fixing frame.

DETAILED DESCRIPTION

In order to clearly illustrate the embodiments of the present disclosure, specific embodiments of the present disclosure will be described with reference to the accompanying drawings in below. It will be apparent that the drawings in the following description are merely exemplary embodiments of the disclosure, and for those who skilled in the art, other drawings can be obtained from these drawings without paying creative work, and other implementations can be obtained.

In order to simplify the drawings, only the parts related to the present disclosure are shown in the drawings, which do not represent the actual structure of the product. In addition, in order to make the picture simple and easy to understand, only one of components having the same structure or function in the drawings is schematically illustrated or marked. In this context, "one" not only means "only one", but also means a situation that "more than one". The debris mentioned includes not only the debris of the electronic module, but also the foreign body mixed during the work process.

As shown in FIG. 1, the present disclosure provides an embodiment of an automatic scrubbing apparatus for the electronic module, comprising: a fixing mechanism for limiting and fixing the electronic module 2, a cleaning brush 4 for brushing the electronic module 2, a driving mechanism for driving the cleaning brush 4 to rotate and move and a spraying mechanism for spraying the bromine-based cleaning agent on the surface of the electronic module 2, and the spraying mechanism sprays the bromine-based cleaning agent through the nozzle 3. Wherein, the bromine-based cleaning agent can choose bromopropane.

Figure 3:
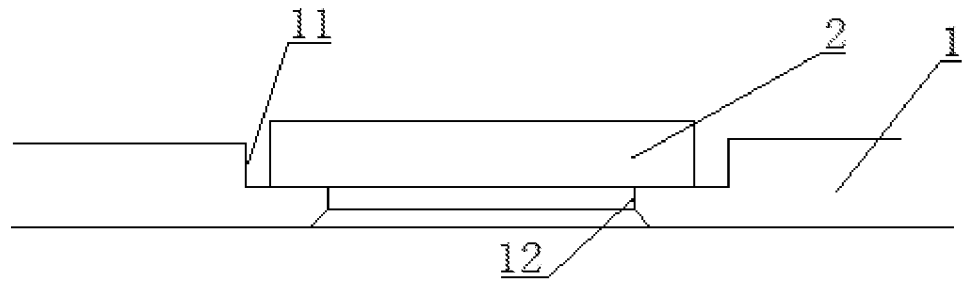
FIG. 3 is a main view of the structure of the electronic module placed on the carrier.
Figure 4:
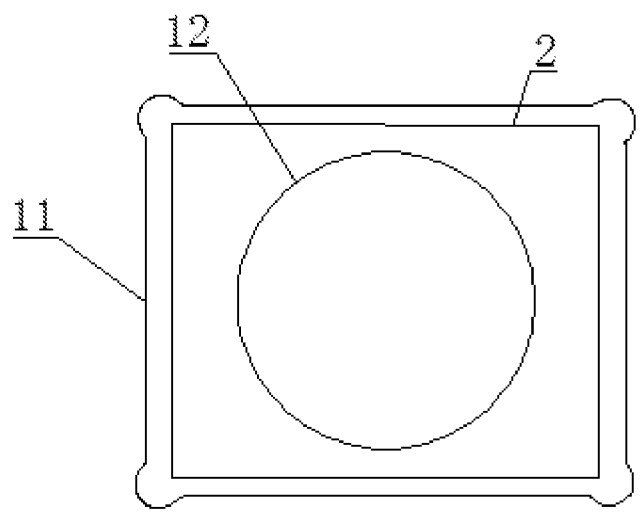
FIG. 4 is a top view of the structure of the electronic module placed on the carrier.

As shown in FIG. 3 and FIG. 4, another preferred embodiment of the present disclosure, the fixing mechanism comprises a carrier 1, there is a groove 11 provided in carrier for holding the electronic module 2, and the depth of the groove 11 is smaller than the height of the electronic module 2 to expose debris on the side surface of the electronic module 2. The cleaning brush 4 is in full contact with the debris of the side surface to carry out cleaning. There is a through hole 12 provided below the groove 11 to outflow the cleaning agent. The carrier 1 can choose a polytetrafluoroethylene carrier.

Figure 5:
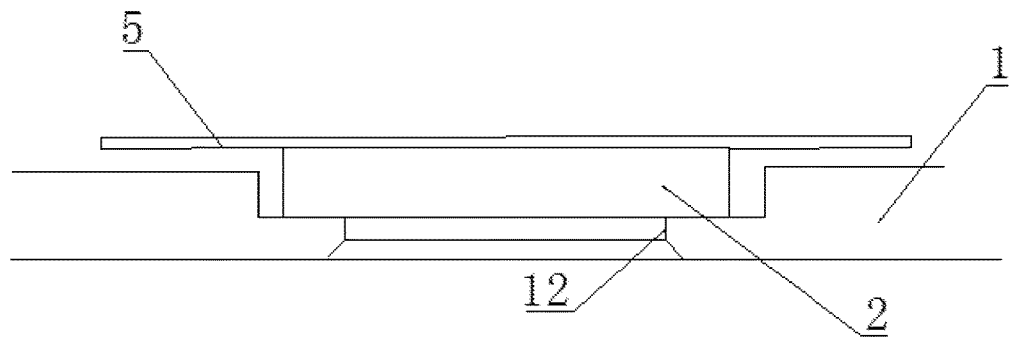
FIG. 5 is a main view of the structure of the electronic module being fixed by the fixing frame.
Figure 6:
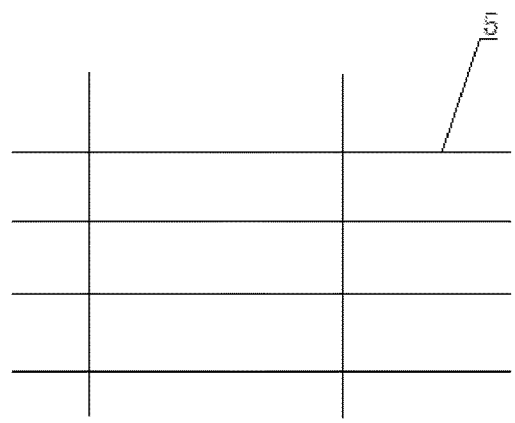
FIG. 6 is a structure diagram of a fixing frame.

As shown in FIG. 5, furthermore, the fixing mechanism also comprises a fixing frame 5, the fixing frame 5 locates above the electronic module 2 to limit the electronic module 2, and the track of the fixing frame 5 and the track of the cleaning brush 4 do not interfere with each other. That is, the fixing frame does not obstruct the moving of the cleaning brush 4 and does not block the cleaning action of the cleaning brush 4 on the surface of the electronic module, particularly on the sides. Wherein, the frame 5 can choose a stainless steel fixing frame with a chess board structure shown in FIG. 6, which is assembled by combining stainless steel bars or is molded as a whole.

Figure 2:
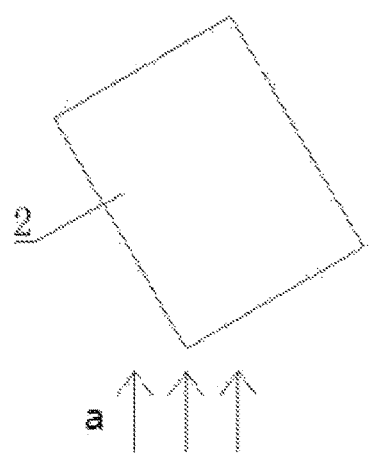
FIG. 2 is an azimuthal diagram of the moving direction of the cleaning brush and the electronic module.

In a preferred example of the present disclosure, the moving direction of the cleaning brush and the side surface of the electronic module are at an angle of 20°-70°. As shown in FIG. 2, the electronic module in FIG. 2 is a cuboid, and its cross section is rectangular. The moving direction of the cleaning brush 4 is the straight line indicated by arrow a.

Figure 7:
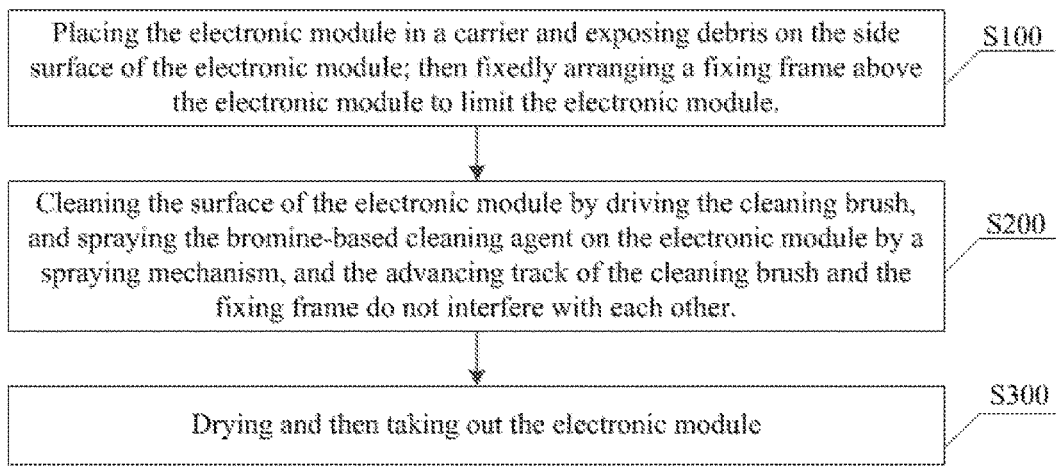
FIG. 7 is a flow chart of a scrubbing method for the electronic module.

The present disclosure also discloses an automatically scrubbing method for an electronic module. Please refer to the flow chart shown in FIG. 7.

An automatically scrubbing method for the electronic module 2 comprises following steps:

S100, as shown in FIG. 3. the electronic module 2 is placed in a carrier 1 and debris on the side surface of the electronic module 2 are exposed; then as shown in FIG. 5, a fixing frame 5 is fixed arranged above the electronic module 2 to limit the electronic module 2;

S200, the surface of the electronic module 2 is cleaned by driving the cleaning brush 4, and the electronic module 2 is sprayed using bromine-based cleaning agent by a spraying mechanism; the bromine-based cleaning agent is sprayed by the spraying mechanism through the nozzle 3.

S300, the electronic module 2 is dried and taken out.

In another preferred embodiment of the present disclosure, the step S100 comprises step S110, placing the electronic module to enable the side surface of the electronic module and the moving direction of the cleaning brush being at an angle of 20°-70°. As shown in FIG. 2, the electronic module in FIG. 2 is a cuboid, and its cross section is rectangular. The moving direction of the cleaning brush 4 is the straight line indicated by arrow a.

It should be noted that the above-described embodiments are free to be combined as desired. While the foregoing is only a preferred embodiment of the present disclosure, it should be noted that modifications and improvements may be made thereto by those skilled in the art without departing from the principles of the present disclosure, which is to be considered in a protection scope of the present disclosure.

What is claimed is:

1. An automatic scrubbing apparatus for an electronic module, comprising:
   a carrier and a fixing frame for limiting and fixing the electronic module;
   a cleaning brush for brushing the electronic module; and
   a nozzle for spraying a bromine-based cleaning agent on a surface of the electronic module;
   wherein the fixing frame locates above the electronic module to limit the electronic module, and a moving track of the fixing frame and a moving track of the cleaning brush do not interfere with each other.

2. The automatic scrubbing apparatus for an electronic module according to claim 1, wherein the carrier for providing a groove to hold the electronic module, and the depth of the groove is smaller than the height of the electronic module to expose debris on a side surface of the electronic module.

3. The automatic scrubbing apparatus for an electronic module according to any one of claim 1, wherein a moving direction of the cleaning brush and a side surface of the electronic module are at an angle of 20°-70°.

4. The automatic scrubbing apparatus for an electronic module according to claim 3, wherein the bromine-based cleaning agent is bromopropane.

5. The automatic scrubbing apparatus for an electronic module according to claim 3, wherein the carrier is a polytetrafluoroethylene carrier.

6. The automatic scrubbing apparatus for an electronic module according to claim 3, wherein the fixing frame is a stainless steel fixing frame with a chess board structure.

* * * * *